(12) United States Patent
Perng et al.

(10) Patent No.: US 8,916,420 B2
(45) Date of Patent: Dec. 23, 2014

(54) CHIP PACKAGE AND MANUFACTURING METHOD THEREOF

(71) Applicant: Xintec Inc., Jhongli, Taoyuan County (TW)

(72) Inventors: Baw-Ching Perng, Baoshan Township (TW); Chun-Lung Huang, Hsinchu (TW)

(*) Notice: Subject to any disclaimer, the term of this patent is extended or adjusted under 35 U.S.C. 154(b) by 0 days.

(21) Appl. No.: 13/900,494

(22) Filed: May 22, 2013

(65) Prior Publication Data

US 2013/0256869 A1 Oct. 3, 2013

Related U.S. Application Data

(62) Division of application No. 12/730,726, filed on Mar. 24, 2010, now abandoned.

(60) Provisional application No. 61/229,146, filed on Jul. 28, 2009.

(51) Int. Cl.
*H01L 23/433* (2006.01)
*H01L 21/56* (2006.01)
*H01L 23/538* (2006.01)
*H01L 23/00* (2006.01)
*H01L 21/683* (2006.01)
*H01L 23/31* (2006.01)
*H01L 23/498* (2006.01)

(52) U.S. Cl.
CPC ..... *H01L 23/433* (2013.01); *H01L 2224/04105* (2013.01); *H01L 21/568* (2013.01); *H01L 2924/15174* (2013.01); *H01L 23/5389* (2013.01); *H01L 24/96* (2013.01); *H01L 2224/97* (2013.01); *H01L 2924/01078* (2013.01); *H01L 2924/15311* (2013.01); *H01L 2224/20* (2013.01); *H01L 2924/15192* (2013.01); *H01L 23/49822* (2013.01); *H01L 24/97* (2013.01); *H01L 2924/01006* (2013.01); *H01L 2924/01027* (2013.01); *H01L 21/6835* (2013.01); *H01L 2924/01082* (2013.01); *H01L 23/49816* (2013.01); *H01L 24/19* (2013.01); *H01L 2924/014* (2013.01); *H01L 21/565* (2013.01); *H01L 23/3107* (2013.01); *H01L 21/561* (2013.01); *H01L 2924/14* (2013.01); *H01L 2924/19041* (2013.01); *H01L 2924/10158* (2013.01); *H01L 2924/01033* (2013.01)
USPC ............... 438/118; 257/659; 257/E21.502; 257/E23.114; 438/114; 438/127; 438/106; 438/107

(58) Field of Classification Search
USPC ............... 257/713, 659, E21.502, E23.114; 438/118, 114, 127, 106, 107
See application file for complete search history.

(56) References Cited

U.S. PATENT DOCUMENTS

| | | | | |
|---|---|---|---|---|
| 5,366,573 A | * | 11/1994 | Bayer et al. | 156/64 |
| 7,261,792 B2 | * | 8/2007 | Higuchi et al. | 156/250 |
| 2004/0248420 A1 | * | 12/2004 | Yun et al. | 438/706 |
| 2005/0233504 A1 | * | 10/2005 | Doi et al. | 438/127 |
| 2006/0216854 A1 | * | 9/2006 | Nishikawa | 438/106 |
| 2007/0296074 A1 | * | 12/2007 | Su et al. | 257/706 |
| 2008/0265383 A1 | * | 10/2008 | Brunnbauer et al. | 257/659 |

* cited by examiner

*Primary Examiner* — Lex Malsawma
*Assistant Examiner* — Sheng Zhu
(74) *Attorney, Agent, or Firm* — Liu & Liu

(57) ABSTRACT

An embodiment provides a chip package including a substrate, a cavity extending downward from an upper surface of the substrate, a metal layer overlying the substrate and conformally covering a sidewall and a bottom portion of the cavity, a chip having an upper surface and located on the metal layer in the cavity, wherein the upper surface is not lower than an upper surface of the metal layer outside of the cavity, and the protective layer covering the chip.

14 Claims, 10 Drawing Sheets

CHIP PACKAGE AND MANUFACTURING METHOD THEREOF

CROSS REFERENCE TO RELATED APPLICATIONS

This Application is a Divisional of U.S. application Ser. No. 12/730,726, filed on Mar. 24, 2010, which claims the benefit of U.S. Provisional Application No. 61/229,146, filed on Jul. 28, 2009, the entirety of which are incorporated by reference herein.

BACKGROUND OF THE INVENTION

1. Field of the Invention

The present invention relates to a chip package, and in particular relates to a chip package having a metal layer covering under the chip.

2. Description of the Related Art

Advances in semiconductor processing technologies are dramatically reducing the feature sizes of integrated circuit (IC) devices such that more semiconductor elements are formed within a smaller chip. In addition to improving chip performance, the wafer area is further saved to reduce manufacturing cost. However, due to the ever-decreasing size of chips and the ever-increasing density of devices formed therein, the amount and the density of the input/output connections are increasing accordingly, such that formation of connection paths to the chip is getting difficult. In addition, when devices with high density operate in a smaller chip, a lot of heat may be generated and performance of the chip may be negatively affected.

BRIEF SUMMARY OF THE INVENTION

According to an illustrative embodiment, a chip package is provided. The chip package includes a substrate, a cavity extending downward from an upper surface of the substrate, a metal layer overlying the substrate and conformally covering a sidewall and also a bottom portion of the cavity, a chip having an upper surface and disposed overlying the metal layer in the cavity, wherein the upper surface is not lower than an upper surface of the metal layer outside of the cavity, and a protective layer covering the chip.

According to an illustrative embodiment, a method of forming one chip package is provided. The method includes providing a temporary substrate, forming a soft insulating layer overlying the temporary substrate, bonding at least one chip overlying the soft insulating layer, hardening the soft insulating layer to form an insulating layer, forming a metal layer overlying the temporary substrate, wherein the metal layer conformally covers the insulating layer and the chip, forming a dielectric layer overlying the metal layer, removing the temporary substrate, removing the insulating layer, and forming a protective layer overlying the chip.

According to another illustrative embodiment, a method of forming a chip package is provided. The method includes providing a temporary substrate, forming an insulating layer overlying the temporary substrate, forming a soft insulating layer overlying the insulating layer, bonding at least one chip overlying the soft insulating layer, forming a metal layer overlying the temporary substrate, wherein the metal layer conformally covers the soft insulating layer and the chip, forming a dielectric layer overlying the metal layer, removing the temporary substrate, removing the soft insulating layer, and forming a protective layer overlying the chip.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

Figure 1A:
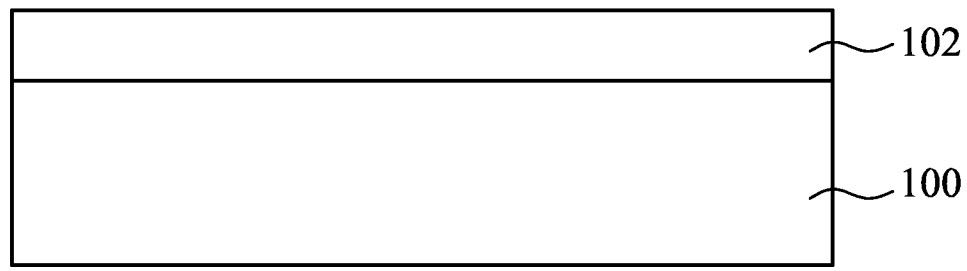
FIGS. 1A-1G are cross-sectional views showing the steps in forming a chip package in accordance with an embodiment of the present invention.

FIGS. 1A-1G are cross-sectional views showing the steps in forming a chip package according to an embodiment of the present invention. As shown in FIG. 1A, a temporary substrate 100 is provided. The temporary substrate 100 includes a semiconductor material, insulating material, metal material, or combinations thereof. In one embodiment, the temporary substrate 100 may be, for example, a silicon wafer or silicon substrate.

Then, a soft insulating layer 102 is formed overlying the temporary substrate 100. In the following process, the soft insulating layer 102 is used to fix a chip disposed thereon. Thus, it is preferable that the soft insulating layer 102 is capable of allowing the chip to penetrate therein, and thus fix the chip. The soft insulating layer 102 may include, for example, a wax, polymer material, or combinations thereof. The soft insulating layer 102 is formed by, for example, a screen printing, lamination printing, or spin coating.

Figure 1B:
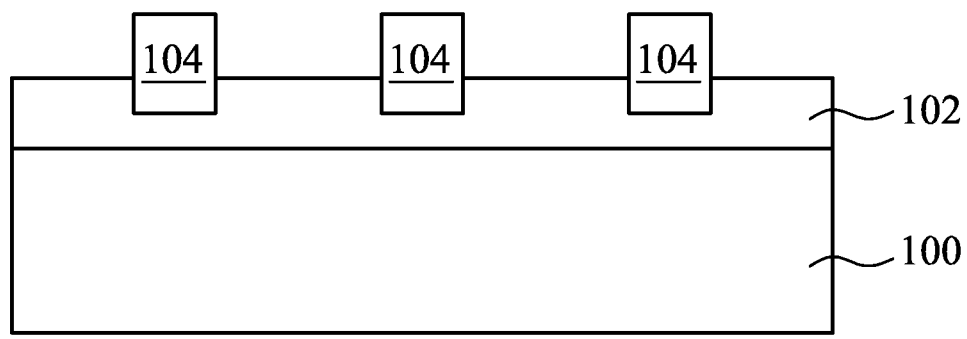

As shown in FIG. 1B, a chip 104 is bonded overlying the soft insulating layer 102. In addition, in another embodiment, more than one chip 104 may be bonded overlying the soft insulating layer 102. These chips may be different kinds of chips and each has its specific function. For example, in one embodiment, the chip 104 may include a logic chip, micro electro mechanical system (MEMS) chip, micro fluidic system chip, physical sensor chip for detecting physical changes such as detecting heat, light, or pressure, RF device chip, accelerator chip, gyroscope chip, micro actuator chip, surface acoustic wave device chip, pressure sensor chip, ink printer head chip, light emitting device chip, or solar cell chip. In addition, sizes or shapes of different chips may be different from each other. In addition, although a sidewall of the chip 104 shown in FIG. 1B is substantially perpendicular to an upper surface of the temporary substrate 100, a chip having a sidewall inclining to the upper surface of the temporary substrate 100 may also be adopted or formed, which may make a conformal deposition of a subsequently formed material layer, such as a metal layer more easy.

In one embodiment, the bonding of the chip 104 includes pressing the chip 104 into the soft insulating layer 102. As shown in FIG. 1B, the chip 104 is pressed such that a portion of the chip 104 penetrates into the soft insulating layer 102 and the chip 104 is fixed.

Figure 1C:
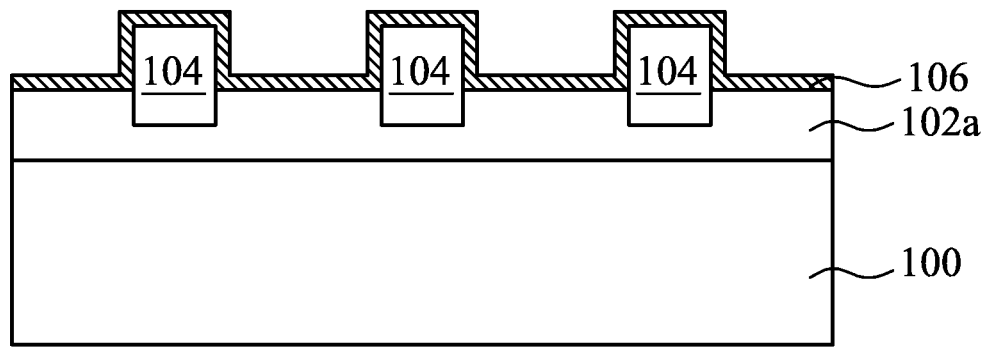

As shown in FIG. 1C, the soft insulating layer 102 is then hardened to form an insulating layer 102a. The hardened insulating layer 102a further fixes the chip 104 and makes the temporary substrate 100 easier to remove in the following process. In one embodiment, the hardening of the soft insulating layer includes irradiating the soft insulating layer 102 with a UV light or heating the soft insulating layer 102, such that the soft insulating layer 102 may be hardened to serve as the insulating layer 102a. The heating temperature may vary according to the material of the soft insulating layer 102, which may range between about 120° C. and about 350° C.

Then, as shown in FIG. 1C, a metal layer 106 is formed overlying the temporary substrate 100. The metal layer 106 conformally covers the insulating layer 102a and the chip 104. In this embodiment, the metal layer 106 directly contacts with the chip 104. In another embodiment, another material layer such as a dielectric layer or another conducting layer may be formed between the chip 104 and the metal layer 106 depending on the situation. The metal layer 106 may be formed by, for example, a physical vapor deposition, sputtering, chemical vapor deposition, electroplating, or electroless plating. In one embodiment, the metal layer 106 is conformally formed overlying the entire surface of the chip 104. In another embodiment, the metal layer 106 may be patterned according to the requirement. For example, the patterned metal layer 106 may serve as a portion of a passive device under the chip 104. In addition, the metal layer 106 facilitates heat dissipation of the chip 104 or may be used to ground the chip.

Figure 1D:
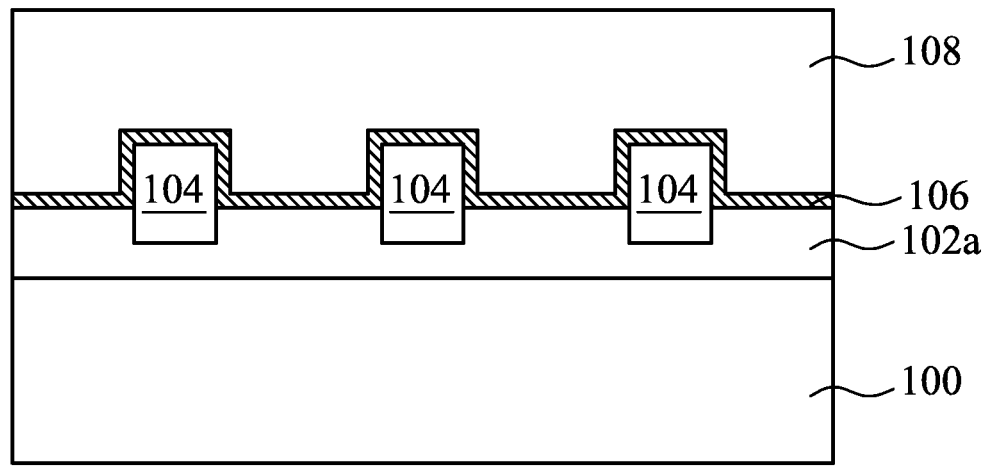

As shown in FIG. 1D, a dielectric layer 108 is formed overlying the metal layer 106. The material of the dielectric layer 108 may be, for example, an epoxy resin, solder mask material, or other suitable insulating material, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The dielectric layer 108 may be formed by a coating method, such as a spin coating, spray coating, or curtain coating method, or other suitable deposition methods, such as a liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition. In the following process, the dielectric layer 108 is going to be used as a substrate supporting the chip 104. Thus, it is preferable that the dielectric layer 108 has a substantially planar upper surface.

Figure 1E:
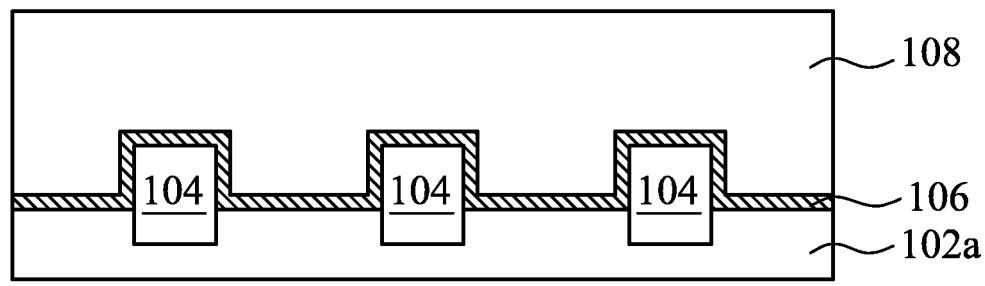
Figure 1F:
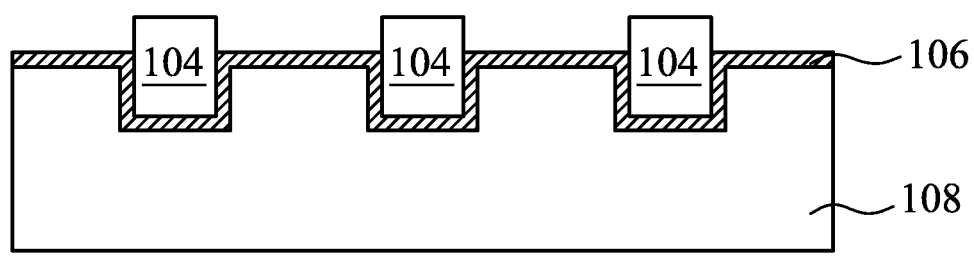

As shown in FIG. 1E, the temporary substrate 100 is removed from the surface of the hardened insulating layer 102a. Then, as shown in FIG. 1F, the insulating layer 102a is removed. In one embodiment, the material of the hardened insulating layer 102a is a wax which can be removed easily. The removing of the insulating layer 102a includes heating the wax to a melting point of the wax, such as 100° C., and then removing the wax using an external force. In this embodiment, the upper surface of the chip 104 is higher than the upper surface of the metal layer 106 beside the chip 104. In another embodiment, the chip 104 is merely bonded overlying the soft insulating layer 102 without sinking into the soft insulating layer 102. The entire chip 104 is located in the dielectric layer 108. Thus, the upper surface of the chip is as high as the upper surface of the metal layer 106 beside the chip 104. The upper surfaces of the chip and the metal layers are coplanar.

Figure 1G:
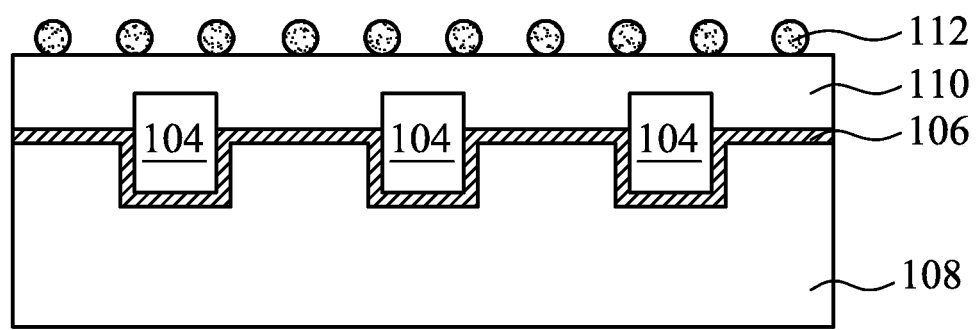

As shown in FIG. 1G, the dielectric layer 108 is now used as a substrate, and a protective layer 110 is formed overlying the chip 104. The material and forming method of the protective layer 110 may be similar to those of the dielectric layer 108. The protective layer 110 may protect the chip 104 from impact by an external force or contamination from outside.

In the embodiment shown in FIG. 1G, conducting structures 112 are further formed overlying the protective layer 110. The conducting structure 112 is electrically connected to the chip 104 through, for example, a conducting via (not shown). In one embodiment, each of the conducting structures 112 is electrically connected to one chip 104 individually. In another embodiment, one of the conducting structures 112 may be electrically connected to two (or more) chips 104 to form a signal transmission bridge between the two different chips. It should be noted that the same chip 104 may be connected with a plurality of conducting structures 112. However, it does not mean that these conducting structures 112 are electrically connected to each other. These conducting structures 112 may be electrically connected to different pads or different device regions of the chip 104 and electrically insulated from each other. In yet another embodiment, the conducting structure 112 may be electrically connected to the metal layer 106. In this case, the conducting structure 112 may be used as a ground electrode.

In one embodiment, the conducting structure 112 may be a solder ball. With the ever-decreasing size of chips and the ever-increasing density of devices formed therein, the amount and the density of input/output connections are increased accordingly. In this case, it is difficult to form conducting structures such as solder balls in a limited chip area. In an embodiment of the invention, a protective layer 110 is formed and thus the conducting structures 112 such as solder balls may be distributed on the protective layer 110 which has a larger area, and thus reduces the problem caused by the high density of the solder balls. In embodiments of the invention, it is preferable to integrate a plurality of chips. Thus, solder balls corresponding to each of the chips are together distributed on the protective layer 110. Not only is distribution density of the conducting structures relaxed, but also the area of the protective layer 110 is effectively utilized which allows the size of the chip package to become smaller.

FIGS. 2A-2G are cross-sectional views showing the steps in forming a chip package according to another embodiment of the present invention, wherein similar or same reference numbers are used to designate similar elements. Materials or formation methods of similar or same material layers are not described repeatedly.

Figure 2A:
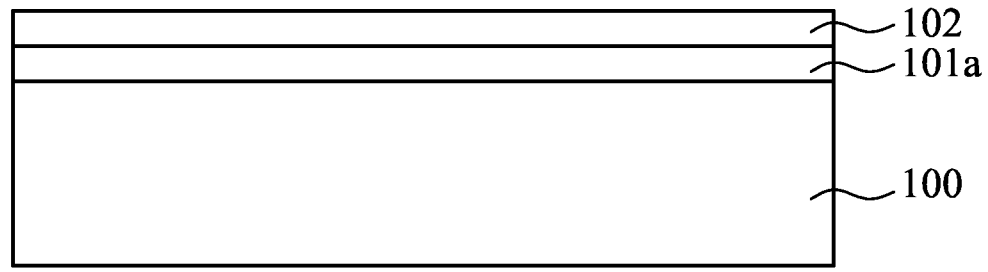
FIGS. 2A-2G are cross-sectional views showing the steps in forming a chip package in accordance with another embodiment of the present invention.

As shown in FIG. 2A, a temporary substrate 100 is provided. Then, an insulating layer 101a is formed overlying the temporary substrate 100. The insulating layer 101a may include a wax, polymer material, or combinations thereof. In one embodiment, a soft insulating layer may be formed overlying the temporary substrate 100 and then hardened to form an insulating layer 101a. For example, the soft insulating layer may be hardened to form the insulating layer 101a by heating the layer or by means of light irradiation, such as using a UV light. Then, a soft insulating layer 102 is formed overlying the insulating layer 101a.

Figure 2B:
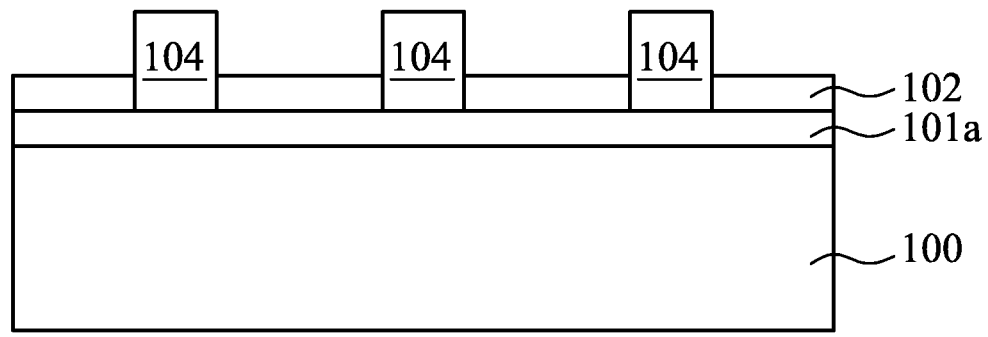

As shown in FIG. 2B, at least one chip 104 is bonded overlying the soft insulating layer 102. In one embodiment, the bonding of the chip 104 includes pressing the chip 104 into the soft insulating layer 102. As shown in FIG. 2B, in this embodiment, the chip 104 is pressed such that a portion of the chip 104 penetrates into the soft insulating layer 102 and is fixed. The chip 104 directly contacts with the insulating layer 101a.

Figure 2C:
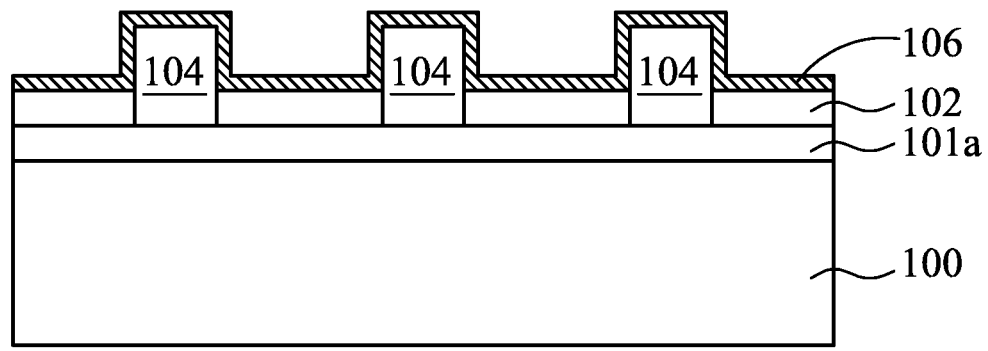

Then, as shown in FIG. 2C, a metal layer 106 is formed overlying the temporary substrate 100. The metal layer 106 conformally covers and overlays the soft insulating layer 102 and the chip 104. In this embodiment, the metal layer 106 directly contacts with the chip 104. In another embodiment, another material layer, such as a dielectric layer or another conducting layer, may be formed between the chip 104 and the metal layer 106 depending on the situation. The metal layer 106 may be formed by a physical vapor deposition, sputtering, chemical vapor deposition, electroplating, or electroless plating. Wherein, when a sputtering is chosen to form the metal layer 106, the soft insulating layer 102 is formed on the insulating layer 101a and may protect the insulating layer 101a thereunder from being bombarded by ion beams and becoming deteriorated, which benefits to a following removing step.

Figure 2D:
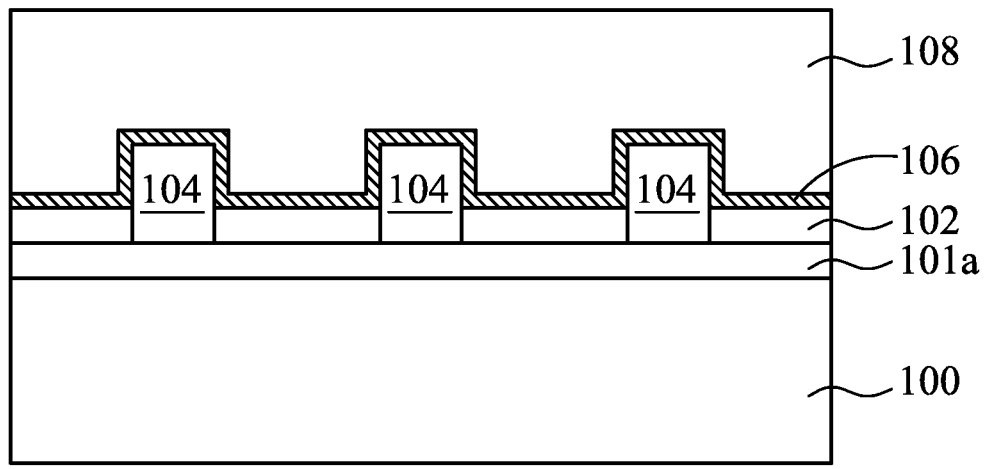

Then, as shown in FIG. 2D, a dielectric layer 108 is formed overlying the metal layer 106. In the following process, the dielectric layer 108 will be used as a substrate supporting the chip 104. Thus, it is preferable that the dielectric layer 108 has a substantially planar upper surface.

Figure 2E:
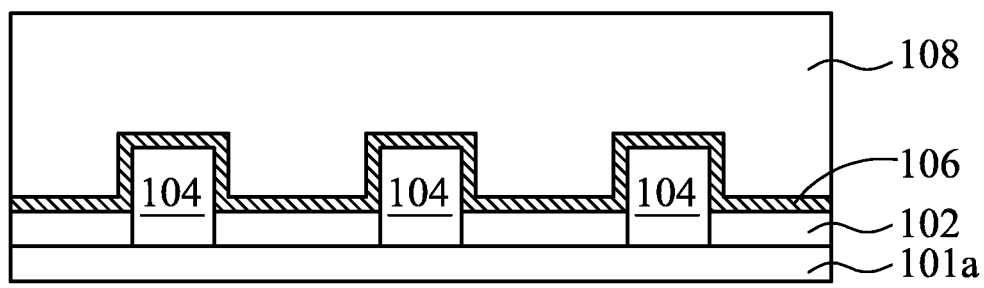
Figure 2F:
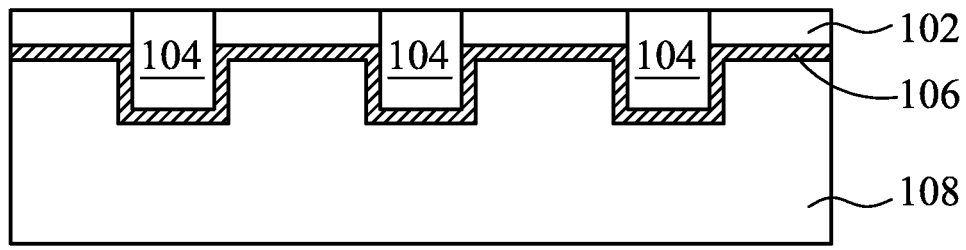

As shown in FIG. 2E, the temporary substrate 100 is removed from the surface of the insulating layer 101a. Then, as shown in FIG. 2F, the insulating layer 101a is removed. In one embodiment, the material of the insulating layer 101a is a wax and is protected by the soft insulating layer 102 from being deteriorated. Thus, the insulating layer 101a may be removed easily. In the embodiment shown in FIG. 2F, the soft insulating layer 102 still remains. The upper surface of the soft insulating layer 102 is coplanar with the upper surface of the chip 104. In another embodiment, the soft insulating layer 102 may be completely or partially removed. In yet another embodiment, the soft insulating layer 102 may be hardened.

Figure 2G:
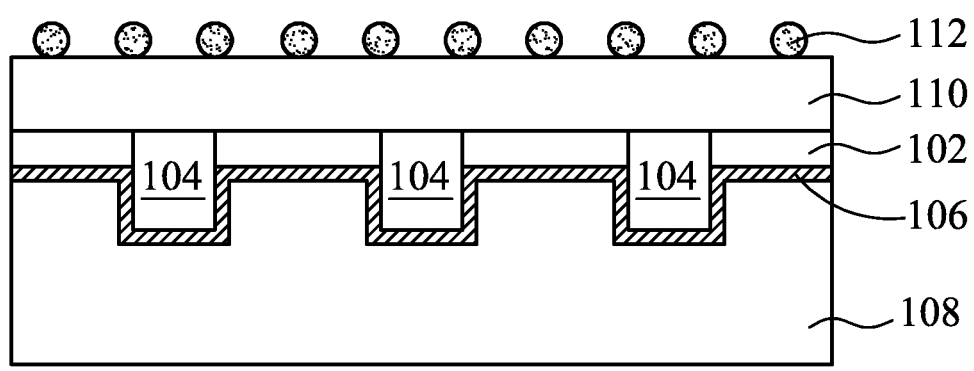

As shown in FIG. 2G, the dielectric layer 108 is now used as a substrate, and a protective layer 110 is formed overlying the chip 104. The protective layer 110 may protect the chip 104 from impact of an external force or contaminations from the environment. In the embodiment shown in FIG. 2G, a plurality of conducting structures 112 are further formed overlying the protective layer 110. The conducting structure 112 is electrically connected to the chip 104 through, for example, a conducting via (not shown).

In the embodiment shown in FIG. 2G, the insulating layer (the soft insulating layer 102 or hardened insulating layer) is located between the metal layer 106 and the protective layer 110 and has an upper surface no higher than the upper surface of the chip 104. For example, in the embodiment shown in FIG. 2F, the upper surface of the insulating layer is as high as and substantially coplanar with the upper surface of the upper surface of the chip 104. Alternatively, in another embodiment, a portion of the insulating layer may be removed such that the upper surface of the insulating layer 102 is lower than the upper surface of the chip 104.

Figure 4A:
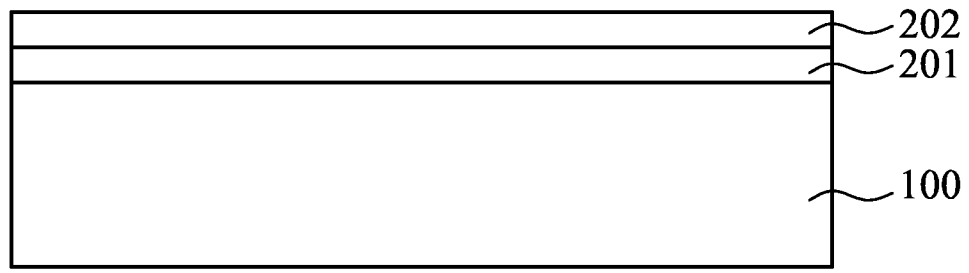
FIGS. 4A-4C are cross-sectional views showing the steps of the bonding of a chip in accordance with an embodiment of the present invention.
Figure 4B:
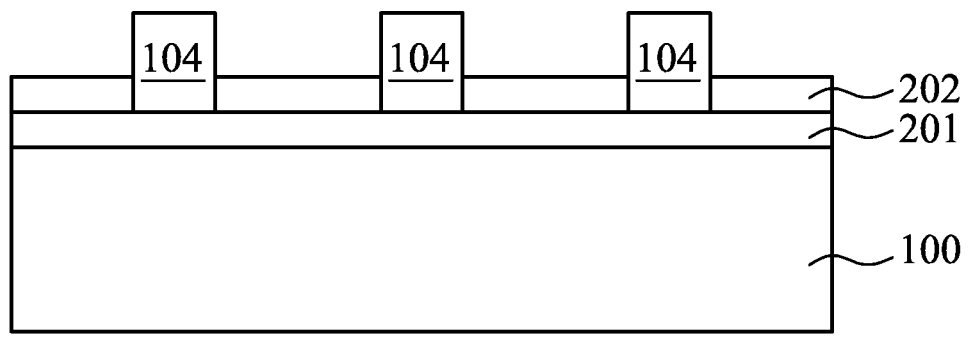
Figure 4C:
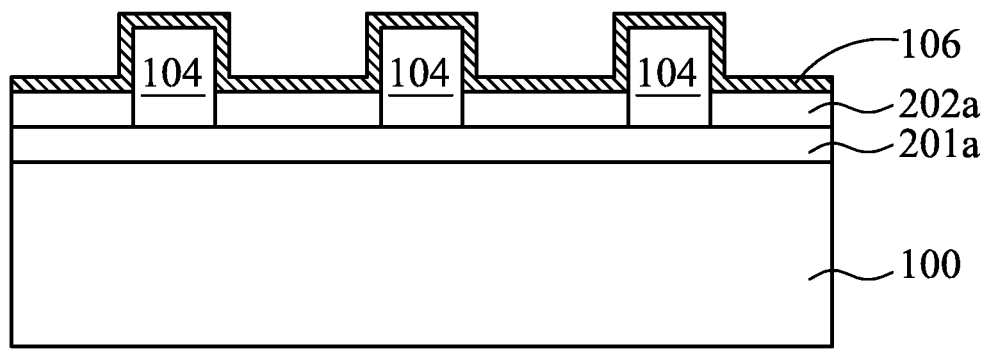

According to embodiments of the invention, the bonding of the chip 104 is not limited to the methods mentioned above. For example, FIGS. 4A-4C are cross-sectional views showing the steps in the chip bonding process in accordance with an embodiment of the present invention. As shown in FIG. 4A, a soft insulating layer 201 and a soft insulating layer 202 are formed overlying the temporary substrate 100 in turn. Then, as shown in FIG. 4B, at least one chip 104 is bonded overlying the soft insulating layer 202. In this embodiment, the bonding of the chip 104 includes pressing the chip 104 into the soft insulating layer 202. As shown in FIG. 4B, a portion of the chip 104 is pressed into the soft insulating layer 202 and is fixed. The chip 104 further directly contacts with the soft insulating layer 201. In another embodiment, the chip 104 merely sinks into the soft insulating layer 202 without directly contacting with the soft insulating layer 201. In yet another embodiment, the chip 104 penetrates through an interface between the soft insulating layer 201 and the soft insulating layer 202 and partially sinks into the soft insulating layer 201. Depth of the chip 104 sinking into the soft insulating layer 202 and/or the soft insulating layer 201 may be adjusted depending on the situation and requirement.

Then, as shown in FIG. 4C, the soft insulating layer 201 is hardened to form an insulating layer 201a, which facilitates a following process of removing the temporary substrate 100. In this embodiment, when the soft insulating layer 201 is hardened, the soft insulating layer 202 is also hardened to be an insulating layer 202a. For example, the soft insulating layers 201 and 202 may be hardened simultaneously by heating.

Alternatively, in another embodiment, a hardened insulating layer 201a is first formed overlying the temporary substrate 100. The soft insulating layer 202 is then formed overlying the insulating layer 201a. Thereafter, the bonding of the chip 104 and the forming of the insulating layer 202a by hardening the soft insulating layer 202 are performed. The bonding of the chip 104 may include, for example, pressing the chip 104 such that a portion of the chip 104 penetrates into the soft insulating layer 202 and directly contacts with the insulating layer 201a. Then, a metal layer 106 is formed overlying the chip 104 and the insulating layer 202a, and other following packaging processes similar to those shown in FIG. 1G or 2G may be performed.

Figure 3A:
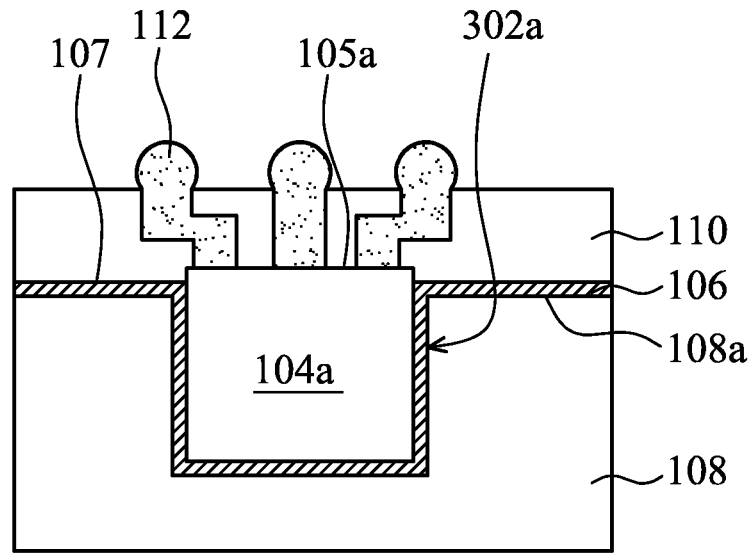
FIGS. 3A-3E are illustrative views showing chip packages in accordance with embodiments of the present invention.

FIGS. 3A-3F are illustrative views showing chip packages according to embodiments of the present invention. FIG. 3A shows a cross-sectional view of a chip package according to an embodiment of the present invention. The chip package includes a substrate (the dielectric layer 108 used as the substrate), a first cavity 302a extending downward from the upper surface 108a of the substrate (dielectric layer 108), a metal layer 106 located overlying the substrate and conformally covering a sidewall and a bottom portion of the first cavity 302a, a first chip 104a having a first upper surface 105a and disposed overlying the metal layer 106 in the first cavity 302a, and a protective layer 110 covering the first chip 104a. In this embodiment of the invention, a first upper surface 105a of the first chip 104a is no lower than the upper surface 107 of the metal layer 106 outside of the first cavity 302a. For example, the first upper surface 105a of the first chip 104a may be higher than the upper surface 107 of the metal layer 106 outside of the first cavity 302a. Alternatively, the first upper surface 105a of the first chip 104a may be substantially coplanar with the upper surface 107 of the metal layer 106 outside of the first cavity 302a. In this embodiment, the metal layer 106 directly contacts with the first chip 104a. When the metal layer 106 is conformally formed overlying the chip, the first chip 104a directly contacts with the metal layer 106 in the first cavity 302a. In addition, the chip package, according to an embodiment of the invention, may further include a conducting structure 112 disposed overlying the protective layer, wherein the conducting structure 112 is electrically connected to the first chip 104a. In addition, a sidewall of the first chip 104a is substantially parallel to the sidewall of the first cavity 302a.

Figure 3B:
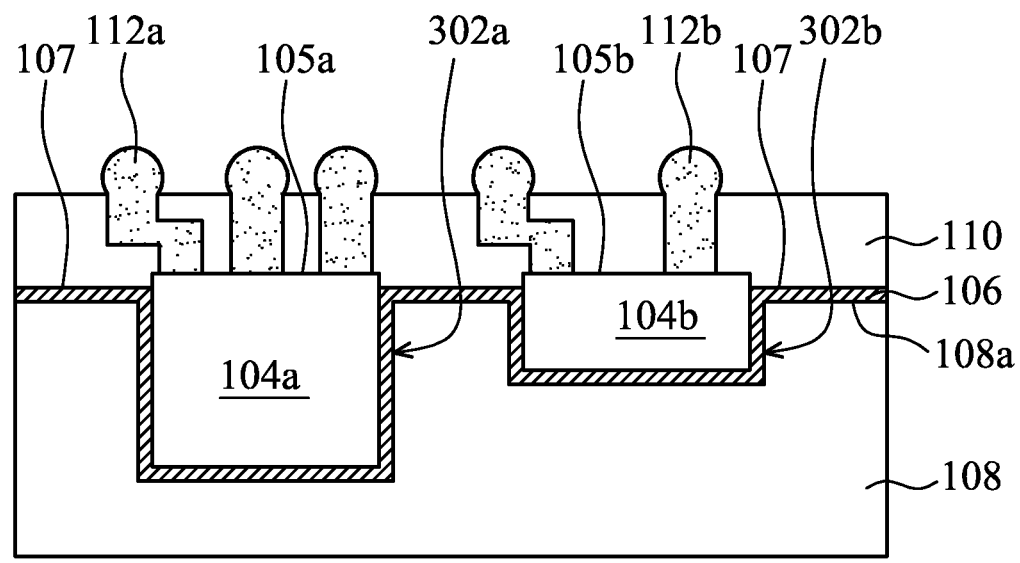
Figure 3C:
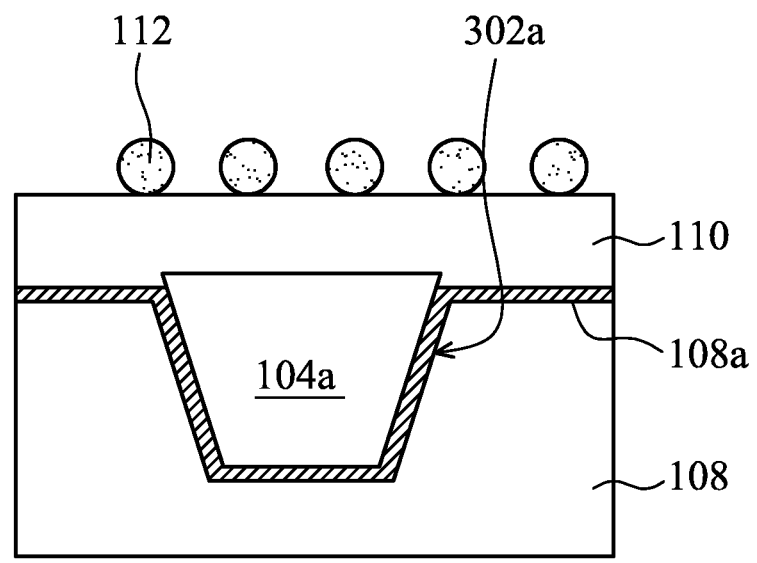

FIG. 3C shows a cross-sectional view of a chip package according to an embodiment of the present invention, which is similar to that shown in FIG. 3A. The main difference is that the sidewall of the first cavity 302a inclines to the upper surface 108a of the substrate (dielectric layer 108). The sidewall of the first chip 104a also inclines to the substrate and is substantially parallel to the sidewall of the first cavity 302a.

Referring to FIG. 3B, a chip package according to an embodiment of the invention may include a second chip 104b (and/or more other chips) disposed overlying the metal layer 106 in the second cavity 302b. The second cavity 302b extends downward from the upper surface 108a of the substrate (dielectric layer 108). Similar to the first chip 104a, a second upper surface 105b of the second chip 104b is no lower than the upper surface 107 of the metal layer 106 outside of the second cavity 302b. The first cavity 302a may have a size or a shape which is different from that of the second cavity 302b. In this embodiment, the metal layer 106 directly contacts with the second chip 104b. When the metal layer 106 is conformally formed overlying the entire exposed surface of the chip, the second chip 104b directly contacts with the metal layer 106 in the second cavity 302b.

In the embodiment shown in FIG. 3B, the first chip 104a has a size and a shape different from those of the second chip 104b. The first chip 104a and the second chip 104b have different functions. The chip package of the embodiment also includes a protective layer and a first conducting structure 112a and a second conducting structure 112b disposed thereon, which are electrically connected to the first chip 104a and the second chip 104b, respectively. One of these conducting structures may be electrically connected to first chip 104a and the second chip 104b at the same time, serving as a signal transmission bridge between the two chips. Alternatively, depending on the situation, the first conducting structure 112a and/or the second conducting structure 112b may be electrically connected to the metal layer 106 through, for example, a conducting agent via penetration of the protective layer 110.

Figure 3D:
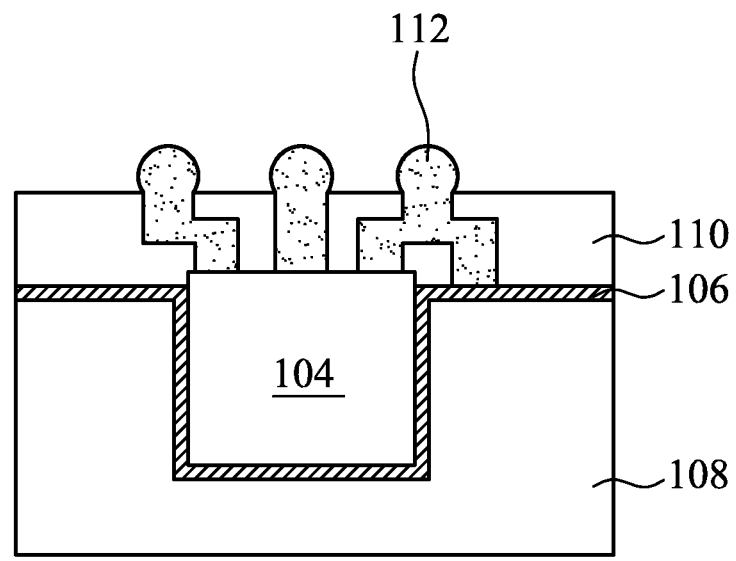
Figure 3E:
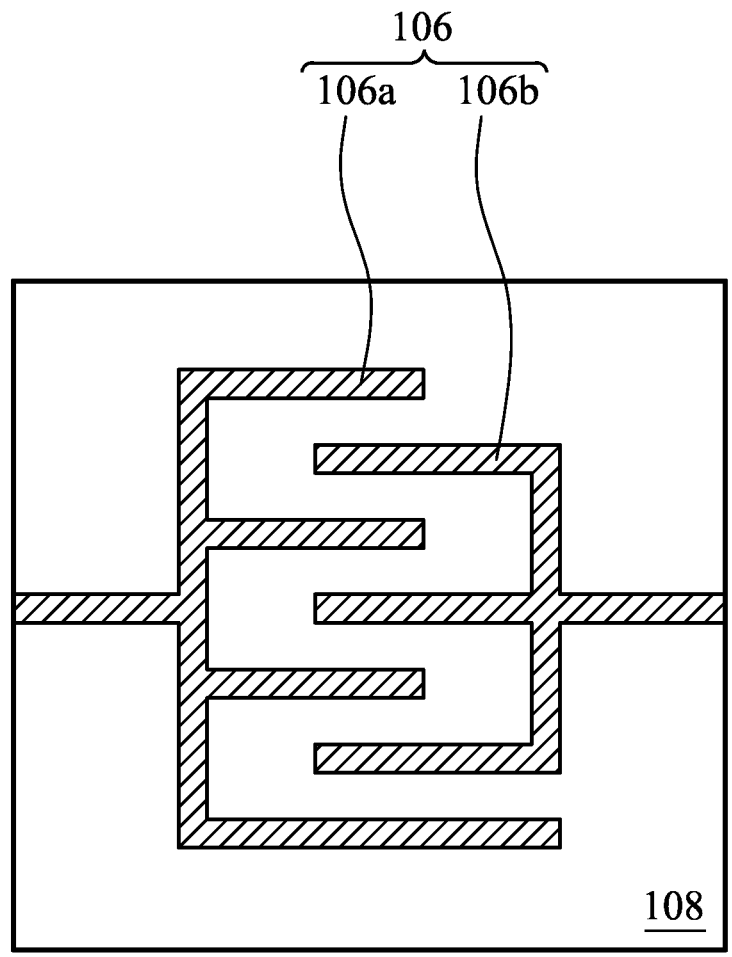

In addition, in one embodiment, the metal layer 106 may further be patterned in the following manner. The patterned metal layer and the substrate (dielectric layer 108) may together form a passive device, such as a capacitor, inductor, or resistor. For example, as shown in FIGS. 3D and 3E, the patterned conducting layer 106 may include a first metal pattern 106a and a second metal pattern 106b (as shown in FIG. 3E). The metal patterns and the substrate may together form a capacitor. The passive device such as a capacitor formed under the bottom portion of the chip may be electrically connected to a specific device in the chip 104 through, for example, the conducting layer 106 and the conducting structure 112. Alternatively, the passive device formed under the bottom portion of the chip may be electrically connected to a specific device in the chip through a conducting path formed in the chip.

In a chip package of an embodiment of the invention, because a metal layer is formed under the chip, heat generated by the chip during operation will be effectively dissipated. The metal layer under the chip has additional functions. For example, the metal layer may be used as a passive device or it can function to ground the chip. Conducting structures such as solder balls are distributed overlying a protective layer with a larger area. Not only is the distribution density of the conducting structures relaxed but also, the area of the protective layer 110 is employed adequately, leading to size shrinkage of the entire system on chip package. The height of the chip can also be controlled easily because the soft layer which is used for bonding can be molded according to different height specifications. In addition, the soft insulating layer, after being hardened, may be removed easily, facilitating packaging of the chip.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a chip package, comprising:
providing a temporary substrate;
forming a first soft insulating layer overlying the temporary substrate;
bonding at least one chip overlying the first soft insulating layer;
hardening the first soft insulating layer to form a first insulating layer;
forming a metal layer overlying the temporary substrate, wherein the metal layer conformally covers the first insulating layer and the chip;
forming a dielectric layer overlying the metal layer;
removing the temporary substrate;
removing the first insulating layer; and
forming a protective layer overlying the chip.

2. The method of forming a chip package as claimed in claim 1, wherein the bonding of the chip comprises pressing the chip such that a portion of the chip penetrates into the first soft insulating layer.

3. The method of forming a chip package as claimed in claim 1, wherein a sidewall of the chip inclines to an upper surface of the temporary substrate.

4. The method of forming a chip package as claimed in claim 1, further comprising forming a second soft insulating layer overlying the temporary substrate before the forming of the first soft insulating layer.

5. The method of forming a chip package as claimed in claim 4, wherein the step of bonding the chip overlying the first soft insulating layer comprises pressing the chip such that a portion of the chip penetrates into the first soft insulating layer and directly contacts with the second soft insulating layer.

6. The method of forming a chip package as claimed in claim 5, further comprising hardening the second soft insulating layer to form a second insulating layer.

7. The method of forming a chip package as claimed in claim 6, wherein the hardening of the second soft insulating layer and the hardening of the first soft insulating layer are performed simultaneously.

8. The method of forming a chip package as claimed in claim 4, further comprising hardening the second soft insulating layer to form a second insulating layer before the forming the first insulating layer.

9. The method of forming a chip package as claimed in claim 8, wherein the bonding of the chip comprises pressing the chip such that a portion of the chip penetrates into the first soft insulating layer and directly contacts with the second insulating layer.

10. A method of forming a chip package, comprising:
provying a temporary substrate;
forming an insulating layer overlying the temporary substrate;
forming a soft insulating layer overlying the insulating layer;
bonding at least one chip overlying the soft insulating layer;
forming a metal layer overlying the temporary substrate, wherein the metal layer conformally covers the soft insulating layer and the chip;
forming a dielectric layer overlying the metal layer;
removing the temporary substrate;
removing the soft insulating layer; and
forming a protective layer overlying the chip.

11. The method of forming a chip package as claimed in claim 10, wherein the bonding of the chip comprises pressing the chip such that a portion of the chip penetrates into the soft insulating layer.

12. The method of forming a chip package as claimed in claim 11, wherein the chip directly contacts with the insulating layer.

13. The method of forming a chip package as claimed in claim 10, wherein the forming of the insulating layer comprises forming a second soft insulating layer overlying the temporary substrate and hardening the second soft insulating layer to form the insulating layer.

14. The method of forming a chip package as claimed in claim 10, further comprising a plurality of conducting structures overlying the protective layer, wherein the conducting structures electrically connect the chip or the metal layer.

* * * * *